US006538472B1

(12) United States Patent
McGee

(10) Patent No.: US 6,538,472 B1
(45) Date of Patent: Mar. 25, 2003

(54) INTERFACE CIRCUITRY

(75) Inventor: Phillip McGee, Owatonna, MI (US)

(73) Assignee: SPX Corporation, Muskegon, MI (US)

( * ) Notice: Subject to any disclaimer, the term of this patent is extended or adjusted under 35 U.S.C. 154(b) by 105 days.

(21) Appl. No.: 09/846,373

(22) Filed: May 2, 2001

(51) Int. Cl.[7] .................. H03K 19/0175; G06F 13/00
(52) U.S. Cl. ..................... 326/82; 701/29; 326/89
(58) Field of Search .................. 701/29; 307/10.1; 326/80, 82, 89, 39

(56) References Cited

U.S. PATENT DOCUMENTS 5,790,965 A * 8/1998 Abe .................. 701/29

* cited by examiner

*Primary Examiner*—Don Le
(74) *Attorney, Agent, or Firm*—Baker & Hostetler LLP

(57) ABSTRACT

Interface circuitry for linking an automobile diagnostic scanner to the electronic control unit of an automobile. The disclosed circuitry provides a lower cost, reduced board space solution for an universal scan tool interface circuitry.

20 Claims, 2 Drawing Sheets

INTERFACE CIRCUITRY

FIELD OF THE INVENTION

The present invention relates to interface circuitry. More particularly, the present invention relates to interface circuitry for use in vehicle diagnostic equipment.

BACKGROUND OF THE INVENTION

Originally developed to help automobile engines meet government emissions regulations under the Clean Air Act, On Board Diagnostics using electronic control units ("ECU") has increasingly been used to control varied aspects of automobile operations. For example, the ECU is now used to control such functions as anti-lock braking, traction control, anti-theft devices, air bag deployment, and cruise control in addition to controlling engine performance to limit emissions and improve performance.

To control engine performance, the ECU receives signals from sensors such as, and by way of example, air and coolant temperature sensor, mass air flow sensor, vane air flow sensor, exhaust gas recirculation valve position sensor, manifold absolute pressure sensor, oxygen sensor, throttle position sensor, knock sensor and crankshaft position sensor to control valves and switches in the engine. Examples of such valves and switches include the exhaust gas recirculation ("EGR") valve, torque converter clutch solenoid, electronic air control valve, fuel injectors, purge control valve, and positive crankcase ventilation ("PVC") valve.

A useful consequence of the use of ECUs for controlling engine performance is that data representing faulty operation of engine components can be stored in the ECU. This data can then be accessed, in the form of trouble codes, in order to diagnose the engine faults as an aid to repairing the vehicle. Numerous devices have been developed for accessing these trouble codes including, for example, hand held computer programmed scanners. In order to utilize one of these scanners, it must be coupled to the ECU through a diagnostic link connector ("DLC").

Originally each automobile manufacturer utilized different ECUs and diagnostic codes. Steps have been taken to standardize these computer control systems by the issuance of standards by the Society of Automobile Engineers ("SAE") for a universal set of diagnostic codes. The SAE has also standardized a sixteen pin DLC, the J1962 connector. As a result, a single "universal" scanner can now be used for testing all 1996 and later automobiles and, using appropriate adaptors, prior non-standard computer control systems. An example of such a scanner is the hand held GENISYS™ diagnostic scan tool sold by the OTC business unit of SPX Corporation, Owatonna, Mich.

In addition to the diagnostic code reading functions provided by the GENISYS™ scanner, this tool also provides additional functionality as described in co-pending U.S. patent application Ser. Nos. 09/702,751 and 09/468,231, the disclosure of which is incorporated herein by reference. While scanners such as the GENISYS™ tool are a vast improvement over prior devices, improvements can still be made to the circuitry to reduce cost and size.

SUMMARY OF THE INVENTION

The foregoing need has been satisfied to a great extent by the present invention wherein in one aspect interface circuitry is provide for an automobile electronic control unit diagnostic scanner. The scanner includes a first resistor, a second resistor and a transistor array. The first resistor is connected at a first end to a collector of a first transistor of the transistor array and at a second end to a first pin of a link connector. The second resistor is connected at a first end to a collector of a second transistor of the transistor array and at a second end to the first pin of the link connector. A plurality of resistance values can be provided at the first pin of the link connector by biasing a base of the first transistor, the second transistor and a base of both transistors.

In another aspect of the invention, the interface circuitry also includes a third resistor connected at a first end to the collector of a third transistor of the transistor array and connected at a second end to the first pin of the link connector. The transistor array is a seven segment display driver NPN array.

In another aspect of the invention a field programmable gate array (FPGA) is electrically connected to the bases of the first, second, and third transistors. First, second, and third inverters are interposed, respectively, between the FPGA and the first, second, and third transistor.

In another aspect of the invention a fourth transistor is provided having a base connected to the FPGA through an inverter. The emitter of the fourth transistor is connected to ground and the collector is connected to a second pin of the link connector through a fourth resistor. A first voltage supply is connected to the emitter of the fourth transistor.

In another aspect of the invention, interface circuitry for an automobile electronic control unit diagnostic scanner is provided including a means for providing a plurality of resistances at a first and second pin of a link connector. Means are also provided for selecting the resistance to be provided at the first and second pin of said link connector. The means for selecting the resistance is a seven segment display driver NPN array.

In yet another aspect of the invention, a method of accessing trouble codes in an automobile electronic control unit is provided. In this method an electronic signal is transmitted from a field programmable gate array. A transistor of a gate array is biased with the transmitted signal and an electronic signal is received at the gate array representative of a trouble code.

There has thus been outlined, rather broadly, the more important features of the invention in order that the detailed description thereof that follows may be better appreciated. There are, of course, additional features of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out several purposes of the present invention. It is important, therefore, that the claims be regarded as including such equivalent constructions insofar as they do not depart from the spirit and scope of the present invention.

DETAILED DESCRIPTION OF PREFERRED EMBODIMENTS OF THE INVENTION

Figure 1:
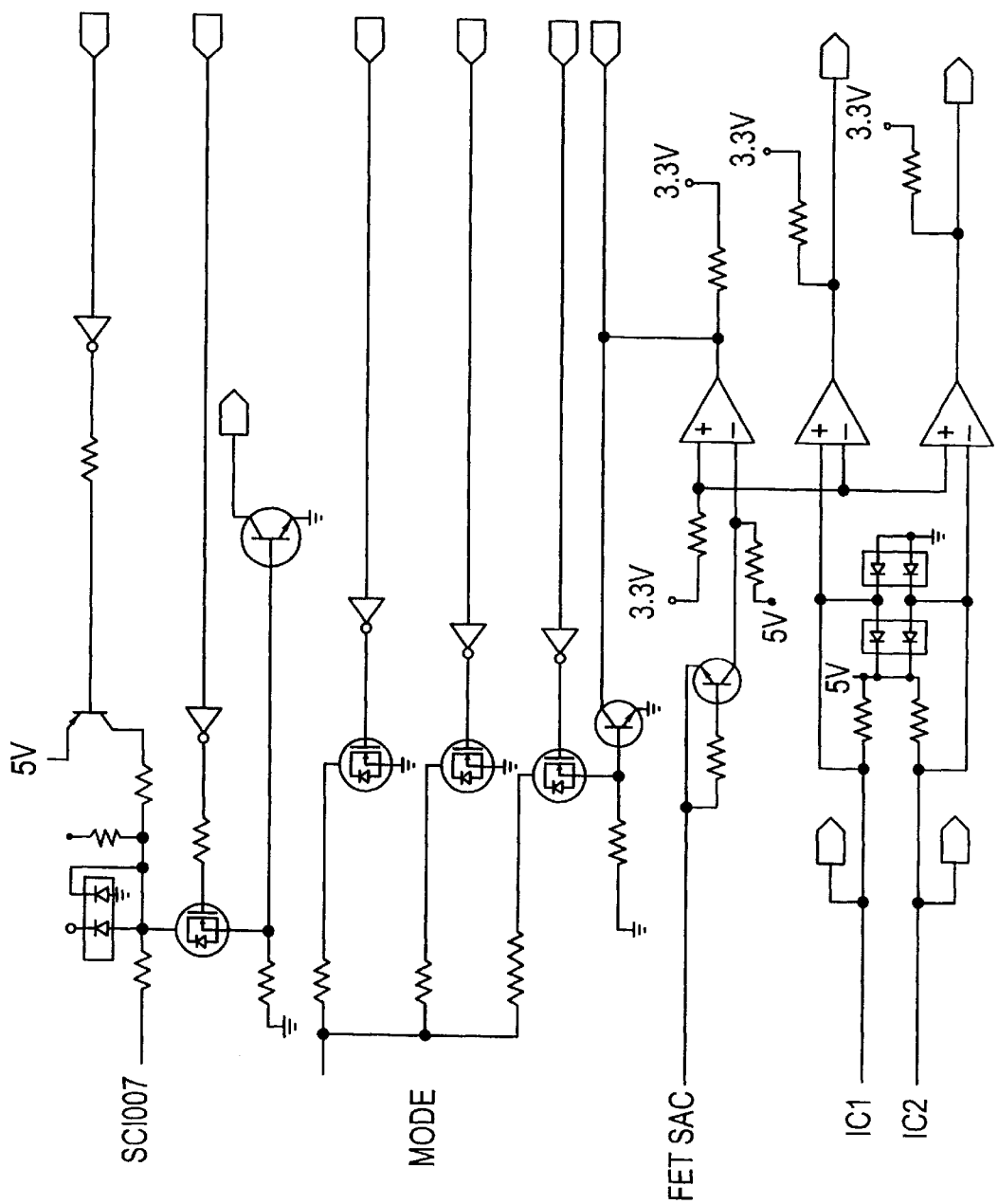
FIG. 1 is an electrical schematic diagram of a first embodiment of the interface circuitry for an automobile diagnostic scan tool.

Referring now to FIG. 1 there is shown an interface circuit for use in connection with a plurality of automobile ECUs. The circuit of FIG. 1 can be driven by the software code of the diagnostic scan tool to provide different voltage and/or resistance values to the DLC. These different voltages and resistance are input to the appropriate pin of the DLC of different makes and models of automobiles to trigger the ECUs to transmit any stored trouble.

Figure 2:
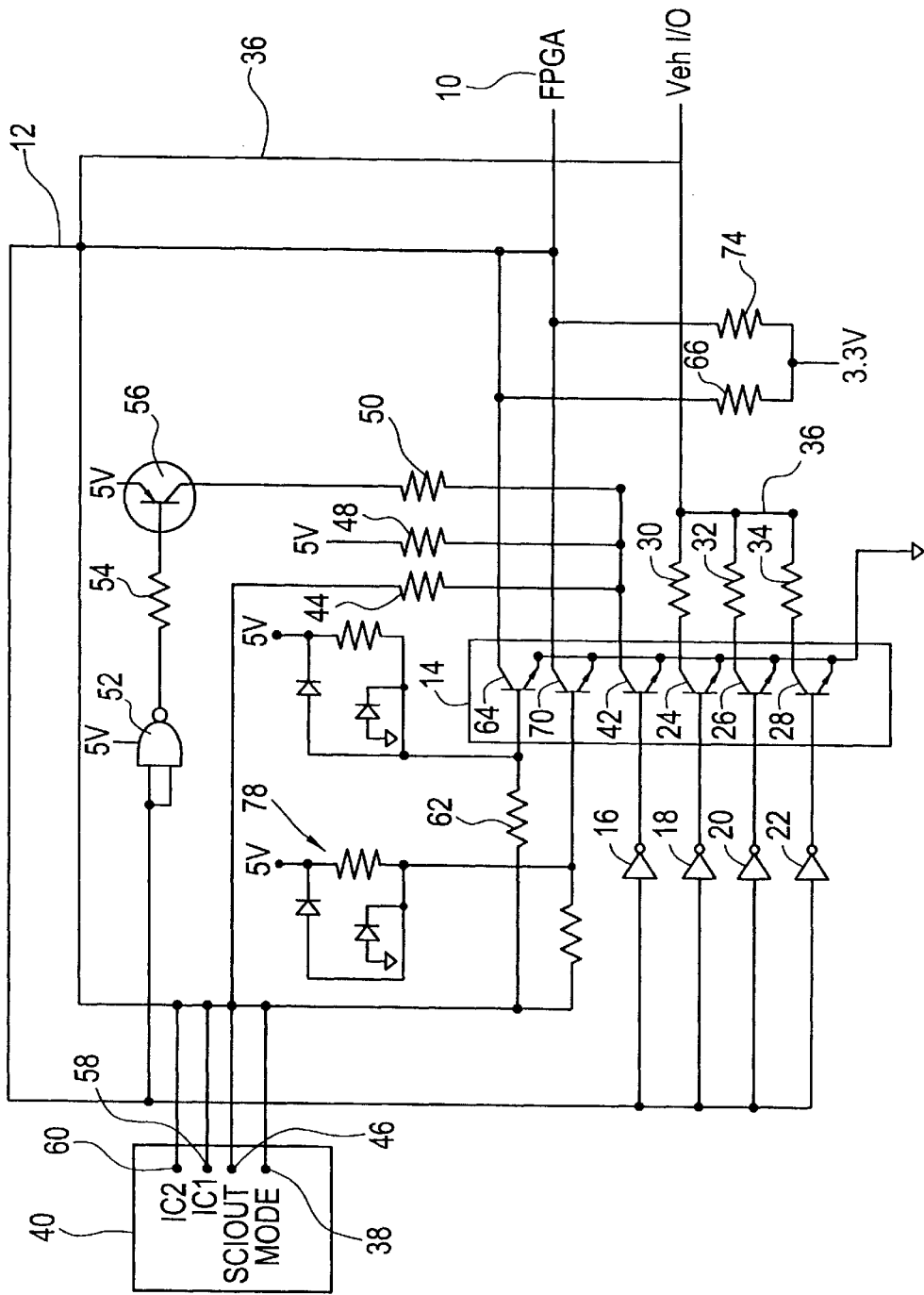
FIG. 2 is an electrical schematic diagram of an alternative embodiment of the interface circuitry for an automobile diagnostic scan tool.

In FIG. 2 there is shown a schematic diagram of an alternative embodiment of an interface circuit for use in connection with a plurality of vehicle ECUs. It should be understood that the circuit of FIG. 2 provides a link between the vehicle ECU and a field programmable gate array ("FPGA") 10 of the diagnostic device. The FPGA 10 is directed by software programming in the diagnostic device to, for example, transmit signals to the ECU in order to retrieve the trouble codes from the ECU.

As described below, in order to provide a universal diagnostic tool, the FPGA transmits signals over a bus line 12 which causes a different voltage and/or resistance to be output to the DLC. In order to select different voltage and/or resistance values a logic high signal is provided to an NPN array 14. In a preferred embodiment of the invention, the NPN array is the seven segment display driver CA3081 NPN Array provided by Intersil Corporation The logic high signal from the FPGA is a 3.3 volt signal but 5 volt inputs are required to bias the transistors of the NPN array 14. Thus, the signals from the FPGA 10 are first provided to inverters 16, 18, 20, 22 to convert logic high signals from the FPGA (nominally 3.3 volts) to logic low signals (nominally 0 volts) and logic low signals from the FPGA (nominally 0 volts) to logic high signals (nominally 5 volts).

When a logic low signal is provided at any one of the inverters 18, 20, 22, the base of the corresponding NPN transistor 24, 26, 28 is biased thereby providing a ground path for the corresponding resistor 30, 32, 34, respectively. Conversely, when a logic high signal is provided at one of the inverters 18, 20, 22, no ground path is provided for the corresponding resistor 30, 32, 34. It should be readily recognized that by providing different logic low signals at the inverters 18, 20, 22, different resistors are provided in parallel, over bus line 36, to the MODE pin 38 of connector 40. The resistance at the MODE pin 38 is used to tell the ECU in certain makes of automobiles what mode to be in, e.g., relay actuation test.

In the preferred embodiment, the resistors are a 10 ohm, 39.2 kilo Ohm, and 10 kilo Ohm resistor. Each of the resistors in the preferred embodiment is a 16 Watt, 1% variance resistor.

When a logic low signal is provided to inverter 16, the base of transistor 42 is biased thereby providing a ground path through the transistor. The collector of the transistor 42 is connected to the SCIOUT pin 46 through a 10 Ohm/16 watt/1% resistor 44. The purpose of the resistor 44 is to limit the current coming from the vehicle through the SCIOUT pin 38 when the input to the inverter 16 is a logic low signal. When the signal to the inverter 16 is a logic high signal, and thus no ground path is provided through transistor 42, a voltage signal is provided to the SCIOUT pin 46.

The voltage to the SCIOUT pin 46 is provided by a 5 volt signal provided through a 33.2 kilo Ohm/16 Watt/1% resistor 48. In addition, for certain Chrysler vehicles that need to pull more current at the SCIOUT pin 46 to trigger the ECU to transmit any stored trouble codes, a 5 volt signal can also be provided through a 200 Ohm/16 Watt/1% resistor 50. When retrieving trouble codes for these Chrysler vehicles, a logic high signal is provided by the FPGA 10 over the bus line 12 to both inputs to the Nand gate 52. This provides a logic low signal across the 10 kilo Ohm/16 Watt/1% resistor 54 to the base of the PNP BJT transistor. When a low signal is output from the Nand gate 52 to the base of the BJT transistor 56 the transistor is biased on and a 5 volt signal is provided across the 200 Ohm resistor 50 to the SCIOUT pin 46 of the connector 40.

Once the ECU has been directed to provide its trouble codes, as a result of the signals provided to the SCIOUT pin 46 and the MODE pin 38, the trouble codes are output as pulse codes on Input Capture lines, IC1 58 and IC2 60. As output from the ECU, a low signal is any pulse having a voltage below 3 volts. A high signal is any pulse having a voltage above 4 volts.

Pulses received from the ECU on the IC1 line are provided across a 10 kilo Ohm/16 Watt/1% resistor 62 to the base of a transistor 64 of the NPN array 14. When a logic high pulse is received at the transistor 64, the transistor 64 is biased on and a low signal is provided to the FPGA 10 over the AUTOIC1 line 65 to the FPGA 10. When a logic low signal is provided at the base of the transistor 64 the transistor is biased off and a 3.3 volt signal is provided through resistor 66 to the AUTOIC1 line 65 to the FPGA 10.

Similarly, pulses received from the ECU on the IC2 line are provided across a 10 kilo Ohm/16 Watt/1% resistor 68 to the base of a transistor 70 of the NPN array 14. When a logic high pulse is received at the transistor 70, the transistor 70 is biased on and a low signal is provided to the FPGA 10 over the AUTOIC2 line 72 to the FPGA 10. When a logic low signal is provided at the base of the transistor 70 the transistor is biased off and a 3.3 volt signal is provided through resistor 74 to the AUTOIC2 line 72 to the FPGA 10.

In order to ensure that the voltage signals provided by the ECU to the NPN array 14, voltage clamps 76, 78 are provided on the IC1 and IC2 lines. The voltage clamps 76, 78 operate to maintain the voltage on the IC1 and IC2 lines between 5.4 volts and −5.4 volts.

In the preferred embodiment, the connector 40 is configured to interface with the J1962 connector standard on all 1996 and later model automobiles. The circuitry may also be provided with a connector selected to interface with one or more of the proprietary connectors in pre-1996 vehicles not provided with the J1962 connector. It should be understood that adaptors can be provided to interface the connector 40 to connectors other than the J1962 connector.

Comparing the above described circuitry to previous designs, it has been found that a 23% reduction in board space consumed by component parts of the input/output circuitry can be achieved with a 51% reduction in component part count, and a 55% reduction in component cost based on standard cost.

The above description and drawings are only illustrative of preferred embodiments which achieve the objects, features, and advantages of the present invention, and is not intended that the present invention be limited thereto. Any modification of the present invention which comes within the spirit and scope of the following claims is considered to be part of the present invention.

What is claimed is:

1. Interface circuitry for an automobile electronic control unit diagnostic scanner, comprising:
   a first resistor;
   a second resistor;
   a transistor array;
   wherein said first resistor is connected at a first end to a collector of a first transistor of the transistor array;
   wherein said second resistor is connected at a first end to a collector of a second transistor of the transistor array;
   wherein said first and said second resistors are connected at their second ends to a first pin of an link connector; and
   wherein a plurality of resistance values can be provided at the first pin of the link connector by biasing a base of the first transistor, the second transistor and a base of both transistors.

2. The interface circuitry of claim 1 further comprising a third resistor connected at a first end to the collector of a third transistor of the transistor array and connected at a second end to the first pin of the link connector.

3. The interface circuitry of claim 2 wherein an emitter of the first and second transistors are tied to ground.

4. The interface circuitry of claim 3 wherein said transistor array is an NPN array.

5. The interface circuitry of claim 4 further comprising a field programmable gate array (FPGA) electrically connected to the bases of the first, second, and third transistors.

6. The interface circuitry of claim 5 further comprising a first, second, and third inverter interposed, respectively, between the FPGA and the first, second, and third transistor.

7. The interface circuitry of claim 6 further comprising a fourth transistor having:
   a base connected to the FPGA through an inverter;
   an emitter connected to ground; and
   a collector connected to a second pin of the link connector through a fourth resistor; and
   wherein a first voltage supply is connected to said emitter of said fourth transistor.

8. The interface circuitry of claim 7 further comprising a second voltage source connected to said emitter of said fourth transistor.

9. The interface circuitry of claim 8 further comprising a fifth transistor having a base connected to an input capture pin from said link connector; and
   having a collector connected to said FPGA.

10. The interface circuitry of claim 9, further comprising a voltage clamp circuit connected to the base of said fifth transistor.

11. The interface circuitry of claim 10, wherein said transistor array is a seven segment display driver.

12. The interface circuitry of claim 11, wherein said first resistance is a 10 kilo Ohm resistor and said second resistor is a 39.2 kilo Ohm transistor.

13. The interface circuitry of claim 12 wherein said first voltage source is 5 volts.

14. Interface circuitry for an automobile electronic control unit diagnostic scanner, comprising:
   means for providing a plurality of resistances at a first and second pin of a link connector; and
   means for selecting the resistance to be provided at the first and second pin of said link connector.

15. The interface circuitry of claim 14 further comprising means for converting signals received at said link connector from an electronic control unit from a first voltage to a second voltage.

16. The interface circuitry of claim 15, wherein said means for providing a plurality of resistances includes an NPN array.

17. A method of accessing trouble codes in an automobile electronic control unit, comprising the steps of:
   transmitting an electronic signal from a field programmable gate array;
   biasing a transistor of a gate array with said transmitted signal; and
   receiving an electronic signal at said gate array representative of a trouble code.

18. The method of claim 17 wherein said gate array is an NPN seven segment display driver array.

19. The method of claim 18 further comprising the step of biasing a second transistor of said gate array to vary the resistance provided to said electronic control unit.

20. The method of claim 19 wherein said step of biasing said second transistor varies the voltage provided to said electronic control unit.

* * * * *